US007710543B2

United States Patent
Oishi

(10) Patent No.: US 7,710,543 B2
(45) Date of Patent: May 4, 2010

(54) SCANNING EXPOSURE APPARATUS AND DEVICE MANUFACTURING METHOD

(75) Inventor: Satoru Oishi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 376 days.

(21) Appl. No.: 11/759,526

(22) Filed: Jun. 7, 2007

(65) Prior Publication Data
US 2007/0291246 A1 Dec. 20, 2007

(30) Foreign Application Priority Data
Jun. 14, 2006 (JP) ............................. 2006-165359

(51) Int. Cl.
G03B 27/52 (2006.01)
G03B 27/42 (2006.01)
G03B 27/58 (2006.01)
G03B 27/32 (2006.01)

(52) U.S. Cl. ..................... 355/55; 355/53; 355/72; 355/77

(58) Field of Classification Search ............... 355/53, 355/72–74, 52, 55, 77; 356/4.08, 624, 609, 356/399–401, 4.01, 4.03–4.05
See application file for complete search history.

(56) References Cited

U.S. PATENT DOCUMENTS

| 5,448,332 | A | * | 9/1995 | Sakakibara et al. | 355/53 |
| 5,693,439 | A | | 12/1997 | Tanaka et al. | |
| 5,751,428 | A | * | 5/1998 | Kataoka et al. | 356/401 |
| 6,063,531 | A | * | 5/2000 | Singh et al. | 430/30 |
| 6,128,089 | A | * | 10/2000 | Ausschnitt et al. | 356/401 |
| 6,236,447 | B1 | * | 5/2001 | Yamada et al. | 355/53 |
| 6,381,004 | B1 | * | 4/2002 | Hagiwara et al. | 355/53 |
| 6,433,872 | B1 | | 8/2002 | Nishi et al. | |
| 6,476,904 | B1 | * | 11/2002 | Kubo | 355/55 |
| 6,608,681 | B2 | | 8/2003 | Tanaka et al. | |
| 6,765,647 | B1 | * | 7/2004 | Nishi | 355/55 |
| 6,992,780 | B2 | | 1/2006 | Sentoku et al. | 356/620 |

(Continued)

FOREIGN PATENT DOCUMENTS

JP 6-260391 9/1994

(Continued)

OTHER PUBLICATIONS

English translation of Japanese Office Action dated Apr. 11, 2008, issued in corresponding Japanese patent application No. 2006-165359.

Primary Examiner—Peter B Kim
Assistant Examiner—Christina Riddle
(74) Attorney, Agent, or Firm—Fitzpatrick, Cella, Harper & Scinto

(57) ABSTRACT

A measurement apparatus includes a measurement unit configured to execute first measurement at each of a plurality of measurement points on a substrate, which are juxtaposed in one of a direction perpendicular to a scanning direction and an oblique direction with respect to the scanning direction, and to execute a second measurement at each of the plurality of measurement points, while the substrate is shifted in a direction different from the scanning direction and a processing unit configured to select some measurement points from the plurality of measurement points on the basis of a change in a measurement value at each measurement point, which is obtained by the first measurement and the second measurement.

12 Claims, 13 Drawing Sheets

U.S. PATENT DOCUMENTS

| | | |
|---|---|---|
| 7,067,826 B2 | 6/2006 | Suzuki et al. ............ 250/491.1 |
| 7,110,116 B2 | 9/2006 | Oishi et al. ................ 356/401 |
| 7,148,973 B2 | 12/2006 | Sentoku et al. ............ 356/620 |
| 7,173,716 B2 | 2/2007 | Oishi et al. ................ 356/620 |
| 7,247,868 B2 | 7/2007 | Suzuki et al. ......... 250/492.22 |
| 2005/0088636 A1* | 4/2005 | Kurosawa ................... 355/53 |
| 2006/0273267 A1 | 12/2006 | Maeda ...................... 250/548 |

FOREIGN PATENT DOCUMENTS

| | | |
|---|---|---|
| JP | 9-293655 | 11/1997 |
| JP | 10-284366 | 10/1998 |
| JP | 2000-260840 | 9/2000 |
| JP | 2002-100552 | 4/2002 |
| JP | 2003-124113 | 4/2003 |
| JP | 2006-339438 | 12/2006 |

* cited by examiner

SCANNING EXPOSURE APPARATUS AND DEVICE MANUFACTURING METHOD

BACKGROUND OF THE INVENTION

1. Field of the Invention

The present invention relates to a technique of measuring the surface position of a substrate by irradiating the surface of the substrate with light and photo-receiving the light reflected by the surface of the substrate and, more particularly, to a scanning exposure apparatus comprising an apparatus which measures the surface position of a wafer serving as an exposure target substrate.

2. Description of the Related Art

The manufacture of a fine semiconductor element by photolithography, such as a semiconductor memory or a logic circuit, a liquid crystal display element, or a thin-film magnetic head, adopts a projection exposure apparatus which causes a projection optical system to project and transfer the circuit pattern drawn on the reticle (mask) onto a wafer, or the like.

Along with an increase in the degree of integration of semiconductor elements, a demand has arisen that a projection exposure apparatus should project and transfer the circuit pattern of the reticle onto a wafer by exposure with a higher resolving power. A minimum dimension (resolution) with which the projection exposure apparatus can transfer is proportional to the wavelength of exposure light, and inversely proportional to the numerical aperture (NA) of a projection optical system. The shorter the wavelength is, the higher the resolution becomes. In recent times, the light source is shifting from superhigh pressure mercury lamps, a g-line with a wavelength of approximately 436 nm, and an i-line with a wavelength of approximately 365 nm, to a short-wavelength KrF excimer laser, with a wavelength of approximately 248 nm, and an ArF excimer laser, with a wavelength of approximately 193 nm. A practical application of an $F_2$ laser, with a wavelength of approximately 157 nm, is also in progress. A demand has also arisen for a further increase in exposure area.

To meet these demands, a step and scan exposure apparatus, i.e., a scanner, which scans a reticle and a wafer relative to each other at a high velocity by using a rectangular slit-like exposure area to accurately expose a wide area, is becoming mainstream in place of a step and repeat exposure apparatus, i.e., a stepper, which reduces an almost square-shaped exposure area to execute cell projection for a wafer.

As shown in FIG. 1, the scanner comprises an illumination unit 10, a reticle stage 25, which supports a reticle 20, a projection optical system 30, a wafer stage 45, which supports a wafer 40, a focus/tilt detection system 50, an alignment detection system 70, and a control system 60. The control system 60 comprises a CPU and a memory, electrically connects to the illumination unit 10, the reticle stage 25, the wafer stage 45, the focus/tilt detection system 50, and the alignment detection system 70, and systematically controls the overall operation of the apparatus.

The alignment detection system 70 detects a misalignment of the wafer 40 in the X- and Y-axis directions. Referring to FIG. 1, the alignment detection system 70 is a so-called off-axis optical system, which uses non-exposure light and is inserted on an optical axis that is shifted from the optical axis of the projection optical system 30.

The wafer stage 45 supports the wafer 40 via a wafer chuck 46. At least three wafer chuck marks are laid out on the wafer chuck to cause the focus/tilt detection system 50 to acquire Z height information and to cause the alignment detection system 70 to acquire X-Y position information. Using a linear motor, or the like, the wafer stage 45 moves the wafer 40 and wafer chuck 46 in the X-axis direction, Y-axis direction, Z-axis direction, and the rotation directions about the respective axes. A laser interferometer, for example, monitors the positions of the reticle stage 25 and the wafer stage 45, to drive the respective stages at a constant velocity ratio.

The focus/tilt detection system 50 detects the position information about the surface position, in the Z-axis direction, and the surface tilt of the wafer 40 during exposure.

Before a predetermined position on the wafer 40 reaches the exposure slit area during exposure, the scanner causes the focus/tilt detection system 50 to measure the surface position at the predetermined position, and executes a correction to match the wafer surface with an optimal image forming position, in exposing the predetermined position.

Various kinds of focus and tilt measurement methods are proposed; see, e.g., Japanese Patent Laid-Open No. 1994-260391.

In recent years, along with a recent decrease in the wavelength of exposure light and a recent increase in the NA of a projection optical system, the depth of focus is becoming very small. A so-called focus accuracy for matching the wafer surface to be exposed with an optimal image forming position is also becoming stricter. Nowadays, especially, a measurement error of the surface position due to the density fluctuations of the pattern on the wafer or the thickness non-uniformity of the resist applied to the wafer is becoming non-negligible.

The measurement error due to the thickness non-uniformity of the resist occurs when a step that is small for the depth of focus, but is fatal for focus measurement is formed near the peripheral circuit pattern or scribe line. Since the tilt angle of the resist-coated surface increases, the focus/tilt detection system 50 detects reflected light at an angle deviated from the regular reflection angle upon reflection or refraction.

The measurement error due to the density fluctuations of the pattern on the wafer occurs when, e.g., the reflectance of the wafer varies such that a sparse pattern area on the wafer has a high reflectance, while a dense pattern area on the wafer has a low reflectance, as shown in FIG. 10. The reflection intensity of the reflected light detected by the focus/tilt detection system 50 is changed as a result, causing an asymmetry, as indicated by (B), with respect to a signal waveform (A) that is free from any pattern density fluctuations. A measurement error, or offset, results, upon a signal process such as a barycentric process.

The foregoing measurement errors degrade the performance of the CD. That is, as shown in FIG. 11, in generating an approximate plane within a certain area in the wafer to match the exposure image forming plane with the wafer surface, when the measurement point mk3 suffers from a large measurement error due to the reflectance difference by Cu, a deviation ΔZ from an actual plane occurs as defocus. When the measurement error is stably measured per unit area (shot) in the wafer, it is possible to manage it as an offset. However, a place like the measurement point mk3 in FIG. 11 exhibits a variation in measurement value. In many cases, the place exhibits low reliability as a measurement error, and even as an offset.

SUMMARY OF THE INVENTION

The present invention has been made in consideration of the above problems, and has as its object to implement a surface position measurement technique that allows a measurement at a measurement point where no process error, such as a wafer step or a reflectance difference, has an influence.

According to the present invention, there is provided a scanning exposure apparatus comprising:

a stage unit configured to support a reticle to be movable in a scanning direction;

a stage unit configured to support a substrate to be movable in the scanning direction and a direction perpendicular to the scanning direction;

an illumination unit configured to illuminate the reticle;

a projection optical system configured to project a pattern of the reticle onto the substrate; and a measurement apparatus configured to measure a surface position of the substrate by irradiating a surface of the substrate with light and photo-receiving the light reflected by the surface of the substrate, the measurement apparatus including:

a measurement unit configured to execute a first measurement at each of a plurality of measurement points on the substrate, which are juxtaposed in one of a direction perpendicular to the scanning direction and an oblique direction with respect to the scanning direction, and to execute a second measurement at each of the plurality of measurement points, while the substrate is shifted in a direction different from the scanning direction; and a processing unit configured to select some measurement points from the plurality of measurement points on the basis of a change in a measurement value at each measurement point, which is obtained by the first measurement and the second measurement.

According to the present invention, there is provided a scanning exposure apparatus comprising:

a stage unit configured to support a reticle to be movable in a scanning direction;

a stage unit configured to support a substrate to be movable in the scanning direction and a direction perpendicular to the scanning direction;

an illumination unit configured to illuminate the reticle;

a projection optical system configured to project a pattern of the reticle onto the substrate; and a measurement apparatus configured to measure a surface position of the substrate by irradiating a surface of the substrate with light and photo-receiving the light reflected by the surface of the substrate, the measurement apparatus including:

a measurement unit configured to execute a first measurement at each of a plurality of measurement points on the substrate, which are juxtaposed in the scanning direction, and to execute a second measurement at each of the plurality of measurement points, while the substrate is shifted in the scanning direction; and a processing unit configured to select some measurement points from the plurality of measurement points on the basis of a change in a measurement value at each measurement point, which is obtained by the first measurement and the second measurement.

According to the present invention, there is provided a device manufacturing method comprising the steps of:

exposing a substrate to light via a reticle using a scanning exposure apparatus defined above;

developing the exposed substrate; and manufacturing a device by processing the developed substrate.

According to the present invention, it is possible to execute a measurement at a measurement position where no process error, such as a wafer step or reflectance difference, has an influence even when it occurs, to result in an improvement in measurement accuracy, suppression of degradation in CD perfomiance, and an improvement in yield.

Further features of the present invention will become apparent from the following description of exemplary embodiments, with reference to the attached drawings.

DESCRIPTION OF THE EMBODIMENTS

Embodiments of the present invention will be described in detail below with reference to the accompanying drawings.

Note that the embodiments to be described hereinafter are merely practical examples of the present invention, and can be appropriately modified or changed in accordance with various conditions and the configuration of an apparatus to which the present invention is applied.

The present invention is applicable to a variety of precision processing apparatuses, a variety of precision measurement apparatuses, and a method of manufacturing a semiconductor device, or the like, using the device manufacturing apparatuses, in addition to manufacturing a device, to be described hereinafter.

The present invention is achieved even by supplying a storage medium which stores software program codes for implementing the functions of the embodiments to be described later to an exposure apparatus and causing the computer, or a CPU or an MPU, to read out and to execute the program code stored in the storage medium.

A "measurement point," as referenced in the following embodiments, is defined as individual elements of each of a plurality of measurement marks especially at a measurement portion.

Description of an Exposure Apparatus

Figure 1:
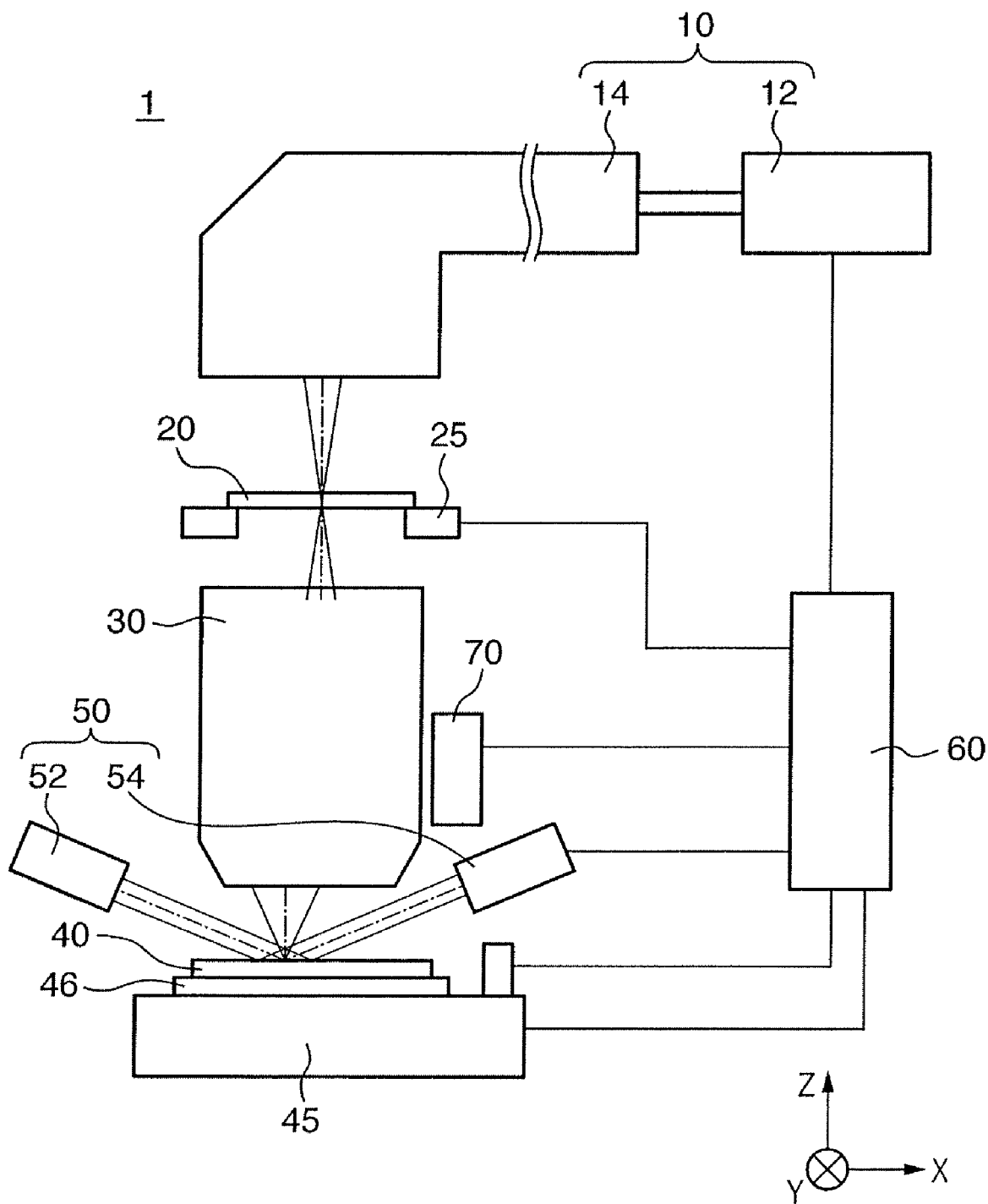
FIG. 1 is a view showing an overall configuration of an exposure apparatus according to an embodiment of the present invention.

FIG. 1 is a view showing an overall configuration of an exposure apparatus according to an embodiment of the present invention.

Referring to FIG. 1, an exposure apparatus 1 is a projection exposure apparatus (scanner), which projects the circuit pattern formed on a reticle 20 onto a wafer 40 by a step and scan technique. The exposure apparatus 1 is suitable for lithography on a submicron order, i.e., a quarter micron or less. The exposure apparatus 1 comprises an illumination unit 10, a reticle stage 25, which supports the reticle 20, a projection optical system 30, a wafer stage 45, which supports the wafer 40, a focus/tilt detection system 50, an alignment detection system 70, and a control system 60. The control system 60 comprises a CPU and a memory, electrically connects to the illumination unit 10, the reticle stage 25, the wafer stage 45, the focus/tilt detection system 50, and the alignment detection system 70, and systematically controls the overall operation of the apparatus.

The illumination unit 10 comprises a light source unit 12 and an illumination optical system 14 to illuminate the reticle 20 on which the circuit pattern to be transferred is formed.

The light source unit 12 can use laser light of, e.g., an ArF excimer laser with a wavelength of approximately 193 nm, or a KrF excimer laser with a wavelength of approximately 248 nm. The type of light source is not limited to an excimer laser, and an $F_2$ laser with a wavelength of approximately 157 nm, or Extreme Ultraviolet (EUV) light with a wavelength of 20 nm or less is also available.

The illumination optical system 14 is an optical system that illuminates the reticle 20 with a light beam emitted by the light source unit 12. The illumination optical system 14 illuminates the reticle 20 by shaping the light beam into a predetermined slit light that is most suited for exposure. The illumination optical system 14 includes lenses, a mirror, an optical integrator, and a stop. For example, a condenser lens, a fly-eye lens, an aperture stop, a condenser lens, a slit, and an image forming optical system are arranged in the order named. The illumination optical system 14 is available irrespective of whether on-axis light or off-axis light is used. The optical integrator includes an integrator formed by stacking a fly-eye lens and two pairs of cylindrical lens array (or lenticular lens array) plates. However, an optical rod or a diffraction element sometimes substitutes for the integrator.

The reticle 20 is made of, e.g., quartz. The circuit pattern to be transferred is formed on the reticle 20. The reticle stage 25 supports and drives the reticle 20. The diffracted light transmitted through the reticle 20 is projected onto the wafer 40 via the projection optical system 30. The reticle 20 and wafer 40 are arranged in an optically conjugate relationship. The reticle 20 and the wafer 40 are scanned at a velocity ratio equal to a reduction magnification ratio to transfer the pattern of the reticle 20 onto the wafer 40. The exposure apparatus 1 includes a reticle detection system serving as an oblique incidence optical system (not shown) to detect the reticle position and to arrange the reticle at a predetermined position.

The reticle stage 25 supports the reticle 20 via a reticle chuck (not shown) and connects to a moving mechanism (not shown). The moving mechanism includes a linear motor and drives and controls the reticle stage 25 in the X-axis direction, the Y-axis direction, the Z-axis direction, and the rotation directions about the respective axes, so as to be able to move the reticle 20.

The projection optical system 30 has a function of image forming the light beam from the object surface onto the image forming plane to image the diffracted light having passed through the pattern formed on the reticle 20 onto the wafer 40.

The wafer 40 is a processing target in which a photoresist is applied onto a silicon substrate. The wafer 40 is also a detection target whose position is to be detected by the alignment detection system 70 and focus/tilt detection system 50.

The alignment detection system 70 detects the misalignment of the wafer 40 in the X- and Y-axis directions. In the arrangement shown in FIG. 1, the alignment detection system 70 is a so-called off-axis optical system, which uses non-exposure light and is inserted on an optical axis shifted from the optical axis of the projection optical system 30.

The wafer stage 45 supports the wafer 40 via a wafer chuck 46. At least three wafer chuck marks are laid out on the wafer chuck to cause the focus/tilt detection system 50 to acquire Z height information and to cause the alignment detection system 70 to acquire X-Y position information. Similar to the reticle stage 25, the wafer stage 45 moves the wafer 40 and wafer chuck 46 in the X-axis direction, the Y-axis direction, the Z-axis direction, and the rotation directions about the respective axes, using linear motors, or the like. A laser interferometer, for example, monitors the positions of the reticle stage 25 and the wafer stage 45 to drive the stages at a constant velocity ratio. The wafer stage 45 is provided on, e.g., a stage base (not shown) supported on the floor, or the like, via a damper having an anti-vibration function. The reticle stage 25 and projection optical system 30 are provided on, e.g., a lens barrel base (not shown) supported on the base frame, installed on the floor, or the like, via a damper.

Following is a description of the focus/tilt detection system 50 in the exposure apparatus 1.

The focus/tilt detection system 50 optically detects position information of the surface position (in the Z-axis direction) of the wafer 40 during exposure. More specifically, the focus/tilt detection system 50 projects a slit-like measurement mark for focus detection onto the wafer 40 via the projection optical system 30 at a high incident angle. The focus/tilt detection system 50 forms the projected image of the measurement mark onto a photo-electric conversion device, such as a CCD, again using a projection optical system 52 and photo-receiving optical system 54. The focus/tilt detection system 50 detects the surface position of the wafer 40 using the signal waveform from the photoelectric conversion device.

Before a predetermined position on the wafer 40 reaches the exposure slit area during scanning exposure, the scanner according to the embodiment causes the focus/tilt detection system 50 to measure the surface position at the predetermined position, and executes correction to match the wafer surface with an optimal image forming position in exposing the predetermined position.

To measure not only the height (focus) of the surface position, but also the surface tilt of the wafer 40, the exposure slit area has a plurality of measurement points, e.g., three to five, including the longitudinal direction of the exposure slit, i.e., a direction perpendicular to the scanning direction.

A plurality of slit-like measurement marks as described above are arranged at the plurality of measurement points to perform focus measurement by forming the projected images of the measurement marks onto individual photoelectric conversion devices again. It is possible to arrange the plurality of marks at the plurality of measurement points in arbitrary directions. The characteristic features of these measurement marks will be explained in detail in the following embodiments.

Furthermore, at a predetermined interval (e.g., 1 mm) in the scanning direction, a plurality of sample shots on the wafer 40 undergo focus measurement by the plurality of measurement marks. The measurement results are statistically processed to detect the surface position (focus and tilt) of the wafer 40.

Focus Measurement Method

Figure 2:
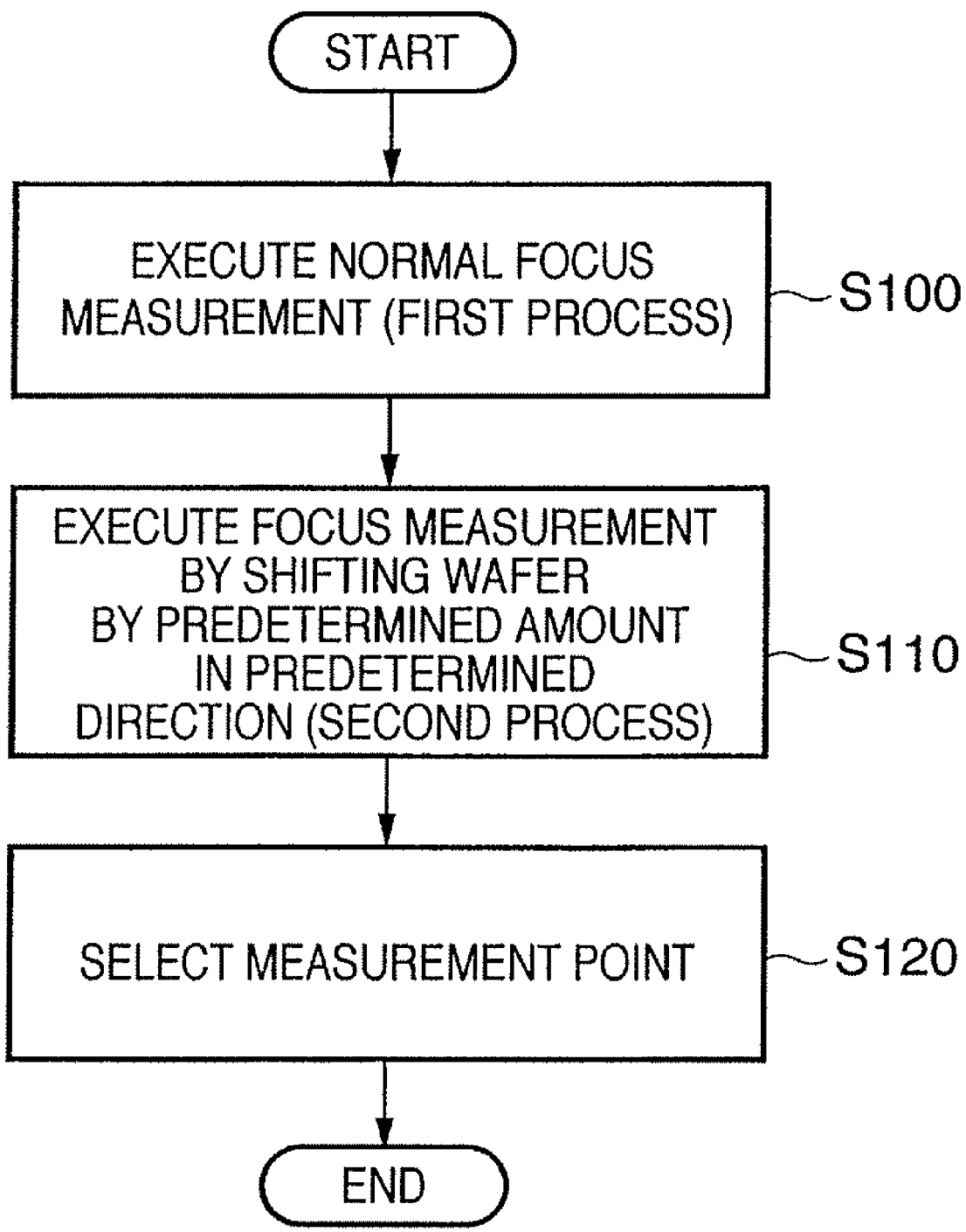
FIG. 2 is a flowchart illustrating a focus measurement procedure according to the embodiment.

FIG. 2 is a flowchart illustrating a focus measurement procedure by the exposure apparatus according to the embodiment.

Referring to FIG. 2, the control system 60 executes normal focus measurement (first process in step S100) using the focus/tilt detection system 50, and executes focus measurement (second process in step S110) by causing the wafer stage 45 to shift the wafer 40 by a predetermined amount in a predetermined direction. The control system 60 selects, as an abnormality, a measurement point where a change in measurement value exceeds a tolerance corresponding to the wafer process (S120). The process design rule determines the tolerance. For example, the tolerance can be defined as 100 nm in the W-CMP process, and 50 nm in the Cu dual damascene process (hereinafter "Cu-DD").

First Embodiment

Figure 3A:
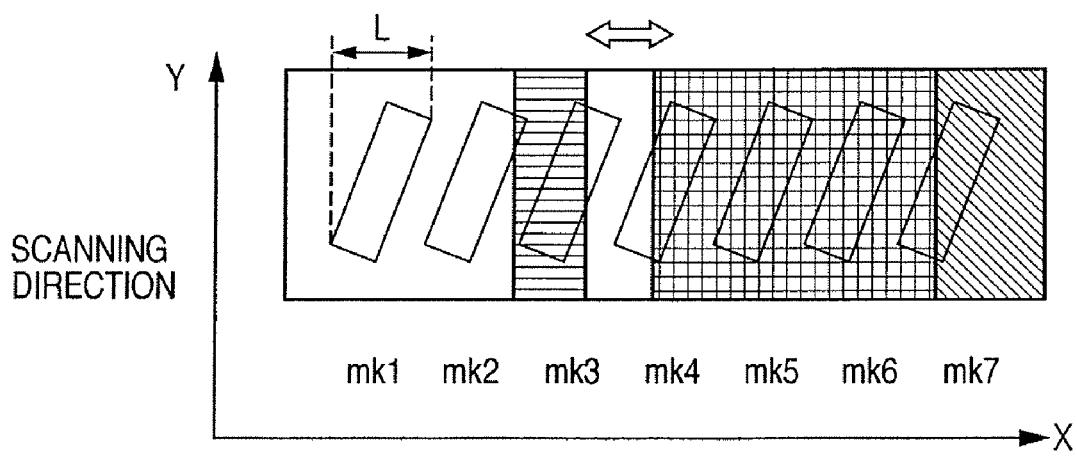
FIGS. 3A and 3B describe a focus measurement method according to the first embodiment.
Figure 3B:
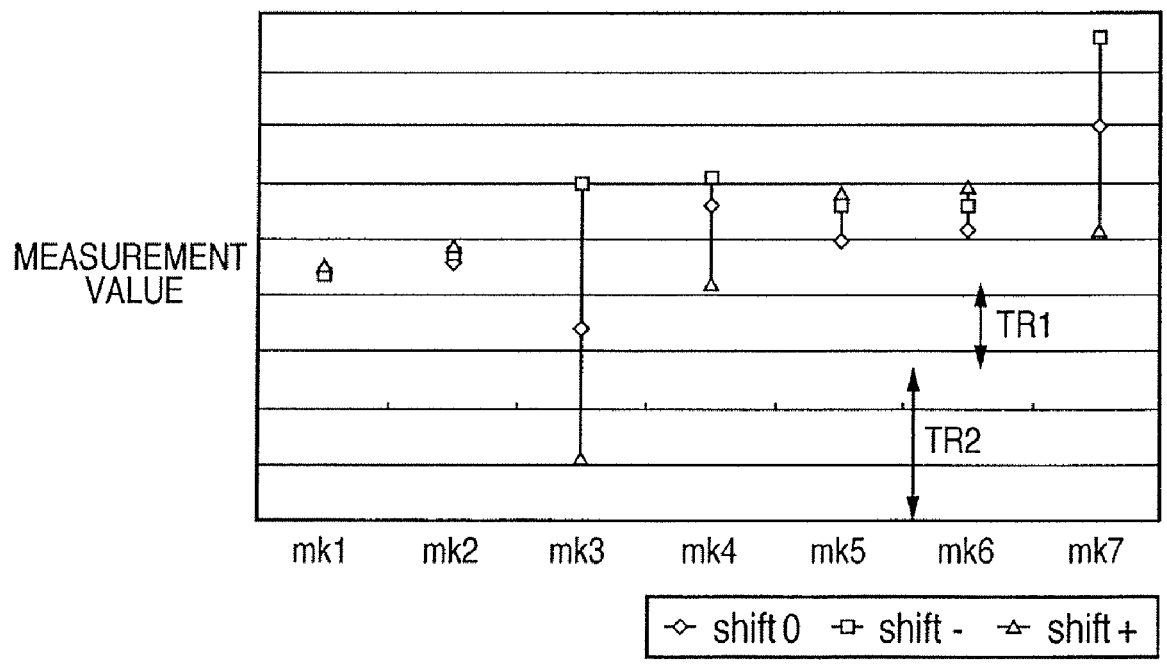

FIGS. 3A and 3B describe a focus measurement method according to the first embodiment. FIGS. 3A and 3B show an application example in which measurement marks align in a direction (X direction) perpendicular to the direction in which the reticle and wafer are scanned.

In FIG. 3A, the predetermined direction in which the wafer is shifted by the predetermined amount in step S110 is the X direction perpendicular to the direction in which the reticle and wafer are scanned. The predetermined wafer shift amount is ±L/4, where L is the measurement mark width in the X direction.

FIG. 3B shows a result when focus measurement according to the first embodiment is applied to a certain process. The normal focus measurement result in step S100 of FIG. 2 corresponds to shift0 in FIG. 3B. The focus measurement results when the wafer is shifted near a measurement point by +L/4 and −L/4 in step S110 correspond to shift− and shift+, respectively, in FIG. 3B. Referring to FIG. 3B, the changes in measurement values obtained in steps S100 and S110 are indicated by vertical lines.

Following is a description of the measurement point selection process in step S120, with reference to FIG. 3B. If FIG. 3B shows a graph which applies to Cu-DD, the measurement points mk3, mk4, and mk7, which exceed a tolerance TR1, are determined to be anomalies. If FIG. 3B shows a graph which applies to W-CMP, the measurement points mk3 and mk7, which exceed a tolerance TR2, are determined to be anomalies.

Second Embodiment

Figures 4A, 4B:
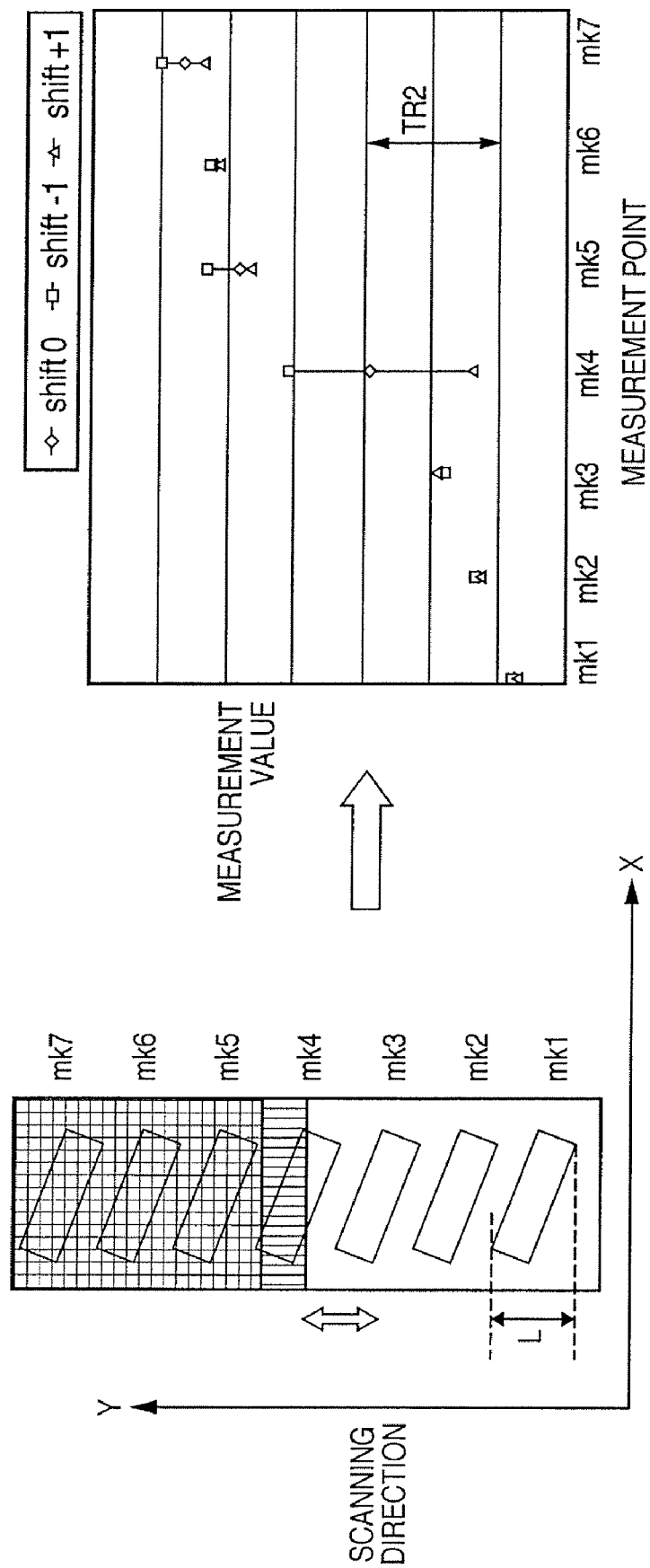
FIGS. 4A and 4B describe a focus measurement method according to a second embodiment.

FIGS. 4A and 4B describe a focus measurement method according to the second embodiment. FIGS. 4A and 4B show an application example in which measurement marks align themselves in the direction (Y direction) in which the reticle and wafer are scanned.

In FIG. 4A, the predetermined direction in which the wafer is shifted by the predetermined amount in step S110 is the Y direction in which the reticle and wafer are scanned. The predetermined wafer shift amount is ±L/4, where L (equivalent to L shown in FIG. 4A) is the measurement mark width in the Y direction.

FIG. 4B shows a result when focus measurement according to the second embodiment is applied to the W-CMP process. Referring to FIG. 4B, a change in measurement value is large at a measurement point mk4. It is, therefore, possible to determine that the measurement point mk4, which exceeds a tolerance TR2 of W-CMP, is an anomaly.

The second embodiment assumes that a wafer step and a reflectance difference are present around the measurement point mk4. Considering data obtained by normal focus measurement (corresponding to shift0) shown in FIG. 4B, an algorithm for determining, as an anomalous value, a portion that exhibits a large difference from an approximate plane fails to remove the measurement point mk4.

Third Embodiment

Figures 5A, 5B:
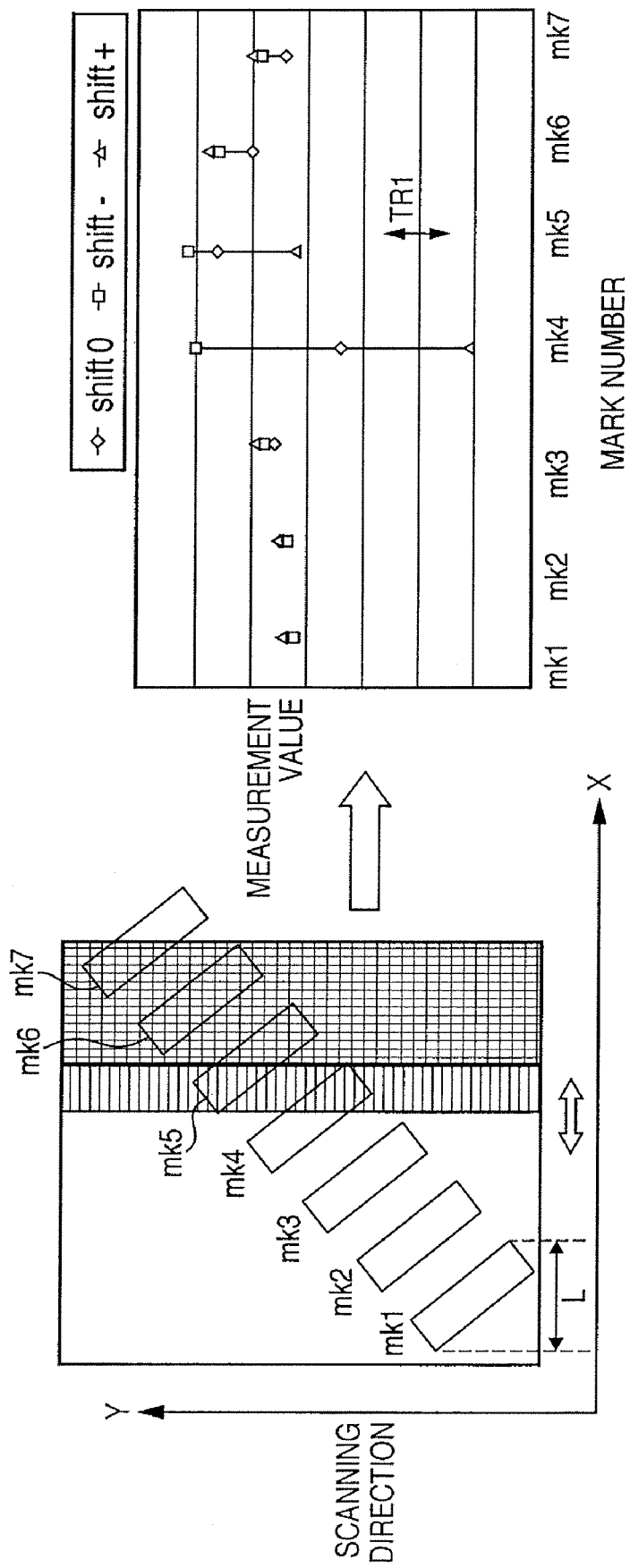
FIGS. 5A and 5B describe a focus measurement method according to a third embodiment.

FIGS. 5A and 5B describe a focus measurement method according to the third embodiment. FIGS. 5A and 5B show an application example in which measurement marks align in an oblique direction.

Referring to FIG. 5A, the measurement points mk4 and mk5 exhibit reflectance differences.

FIG. 5B shows a result when focus measurement according to the third embodiment is applied to the Cu-DD process. Referring to FIG. 5B, a change in measurement value is large at measurement points mk4 and mk5. It is, therefore, possible to determine, that the measurement points mk4 and mk5, which exceed a tolerance TR1, are anomalies.

Fourth Embodiment

Figure 6:
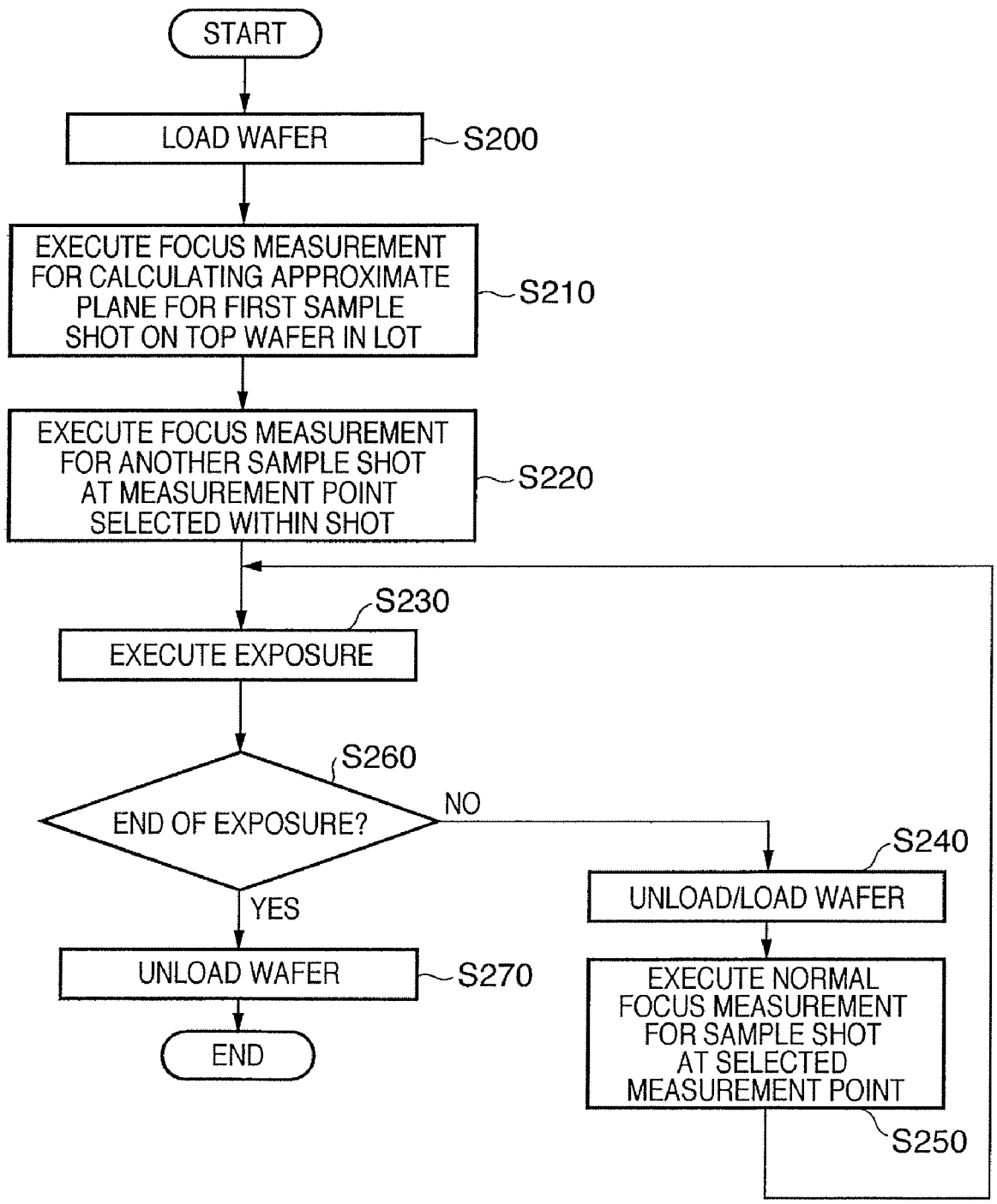
FIG. 6 is a flowchart illustrating a focus measurement method according to a fourth embodiment.

FIG. 6 is a flowchart illustrating a focus measurement method according to the fourth embodiment.

The fourth embodiment is an example in which the focus measurement method is applied only to the first sample shot on the top wafer in a lot.

Referring to FIG. 6, the top wafer in the lot is loaded onto a wafer stage (S200). After that, the first sample shot on the top wafer in the lot undergoes focus measurement to select a plurality of measurement points within the shot (S210).

Another sample shot undergoes focus measurement at the measurement points determined in step S210 to calculate an offset from an approximate plane at a valid measurement point and to store it in the apparatus (S220).

The top wafer is exposed (S230). The exposed top wafer is recovered to load the second wafer (S240). Subsequently, the sample shot undergoes normal focus measurement at the measurement points determined in step S210 (S250). The second wafer is exposed using the focus measurement result obtained in step S250, and the offset calculated in step S220 (S230).

The processes in steps S230 to S250 are repeated until all the wafers are exposed in step S260. When the last wafer is exposed, it is recovered in step S270.

Fifth Embodiment

Figure 7:
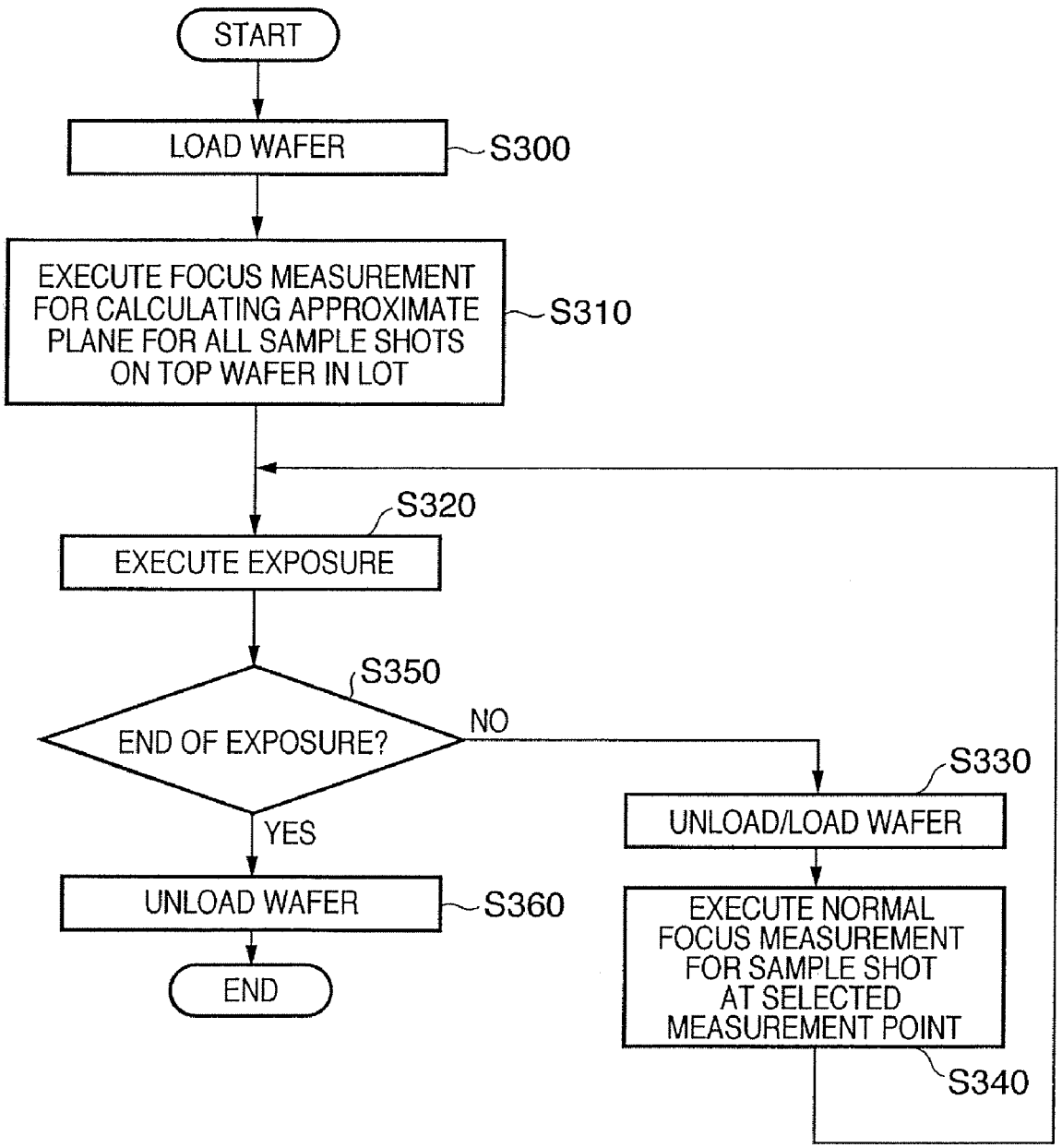
FIG. 7 is a flowchart illustrating a focus measurement method according to a fifth embodiment.

FIG. 7 is a flowchart illustrating a focus measurement method according to the fifth embodiment.

The fifth embodiment is an example in which the focus measurement method is applied only to all of the sample shots on the top wafer in a lot.

Referring to FIG. 7, the top wafer in the lot is loaded onto a wafer stage (S300). After that, all of the sample shots on the top wafer in the lot undergo focus measurement to select a plurality of measurement points within the shot (S310).

According to the fifth embodiment, a change in measurement value at an identical position within each sample shot is measured a number of times corresponding to the number of sample shots. A measurement point is selected on the basis of the average value obtained by dividing changes in measurement values by the number of sample shots.

In step S310, an offset from an approximate plane at a valid measurement point is calculated and stored in the apparatus.

The top wafer is exposed in step S320. The exposed top wafer is recovered to load the second wafer in step S330. Subsequently, in step S340, the sample shot undergoes normal focus measurement at the measurement points determined in step S310. The second wafer is exposed in step S320, using the focus measurement result obtained in step S340 and the offset calculated in step S310.

The processes in steps S320 to S340 are repeated until all the wafers are exposed in step S350. When the last wafer is exposed, it is recovered in step S360.

Sixth Embodiment

Figure 8:
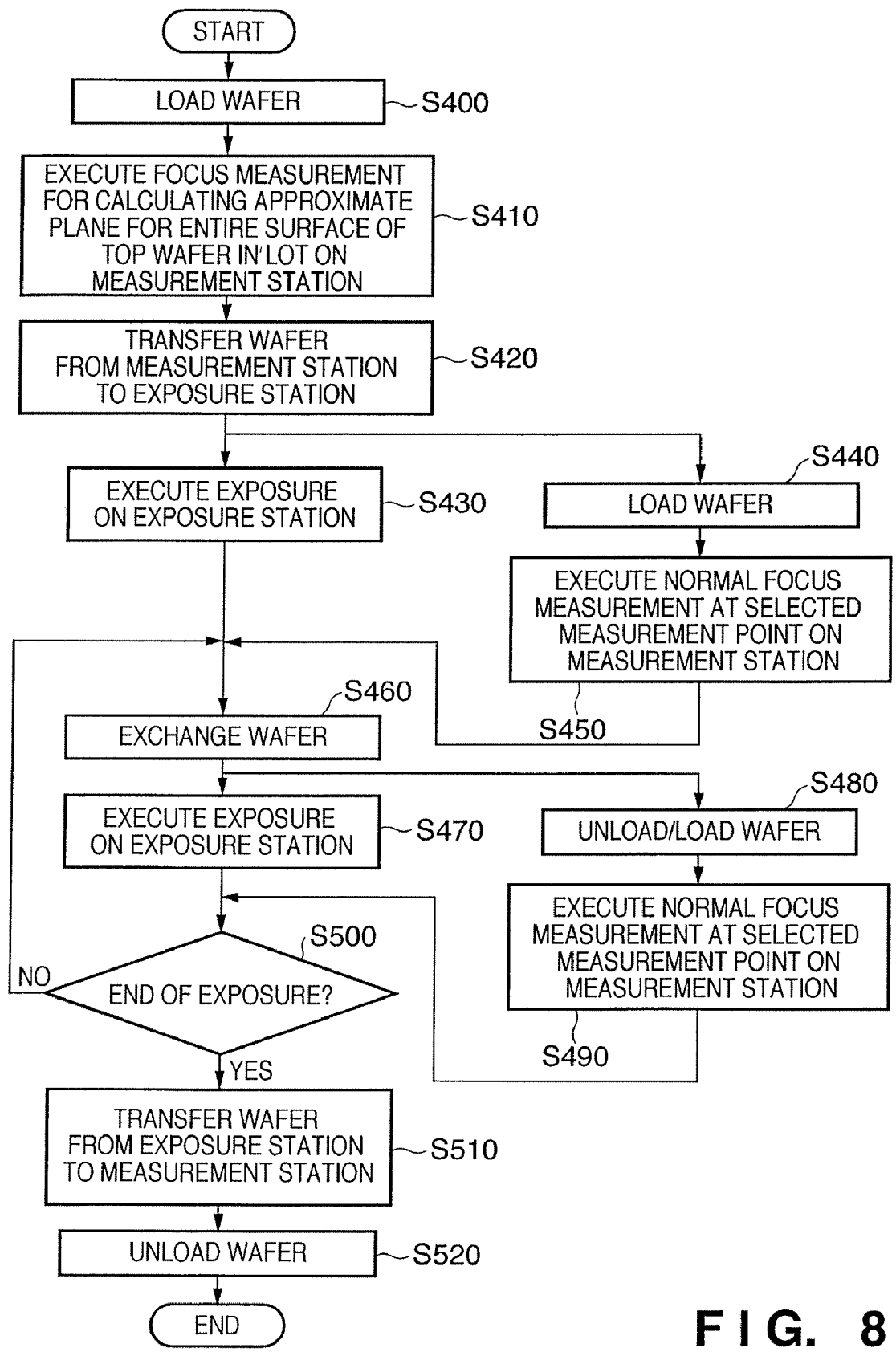
FIG. 8 is a flowchart illustrating a focus measurement method according to a sixth embodiment.

FIG. 8 is a flowchart illustrating a focus measurement method according to the sixth embodiment.

The sixth embodiment is an example in which the focus measurement method is applied to a twin stage, and only to the top wafer in a lot on a measurement station.

The twin stage has an advantage of simultaneously executing focus measurement on a measurement station and exposure on an exposure station. Unlike the fourth and fifth embodiments, the target of wafer focus measurement on the measurement station need not be limited to the sample shot. All of the shots may undergo focus measurement in the background of the exposure.

Referring to FIG. 8, the top wafer in the lot is loaded onto the measurement station (S400). Subsequently, the entire surface of the top wafer in the lot undergoes focus measurement on the measurement station to select a plurality of measurement points on the entire surface of the wafer. At the same time, an offset from an approximate plane at a valid measurement point is calculated and stored in the apparatus (S410).

In step S420, the top wafer is transferred from the measurement station to the exposure station. In step S430, the top wafer is exposed on the exposure station. In step S440, the second wafer is loaded while the top wafer undergoes exposure. In step S450, the second wafer undergoes normal focus measurement at the measurement points determined in step S410.

In step S460, the exposed wafer on the exposure station is exchanged with the unexposed wafer on the measurement station. The unexposed wafer is exposed using the focus measurement result obtained in step S450 and the offset obtained in step S410 (S470). Meanwhile, the exposed wafer is recovered in step S480 to load the third wafer onto the measurement station. On the measurement station, the third wafer undergoes focus measurement at the measurement points determined in step S410. The processes in steps S460 to S490 are repeated until all of the wafers are exposed in step S500. When the last wafer is exposed, it is transferred from the exposure station to the measurement station in step S510 and recovered in step S520.

Seventh Embodiment

Figure 9:
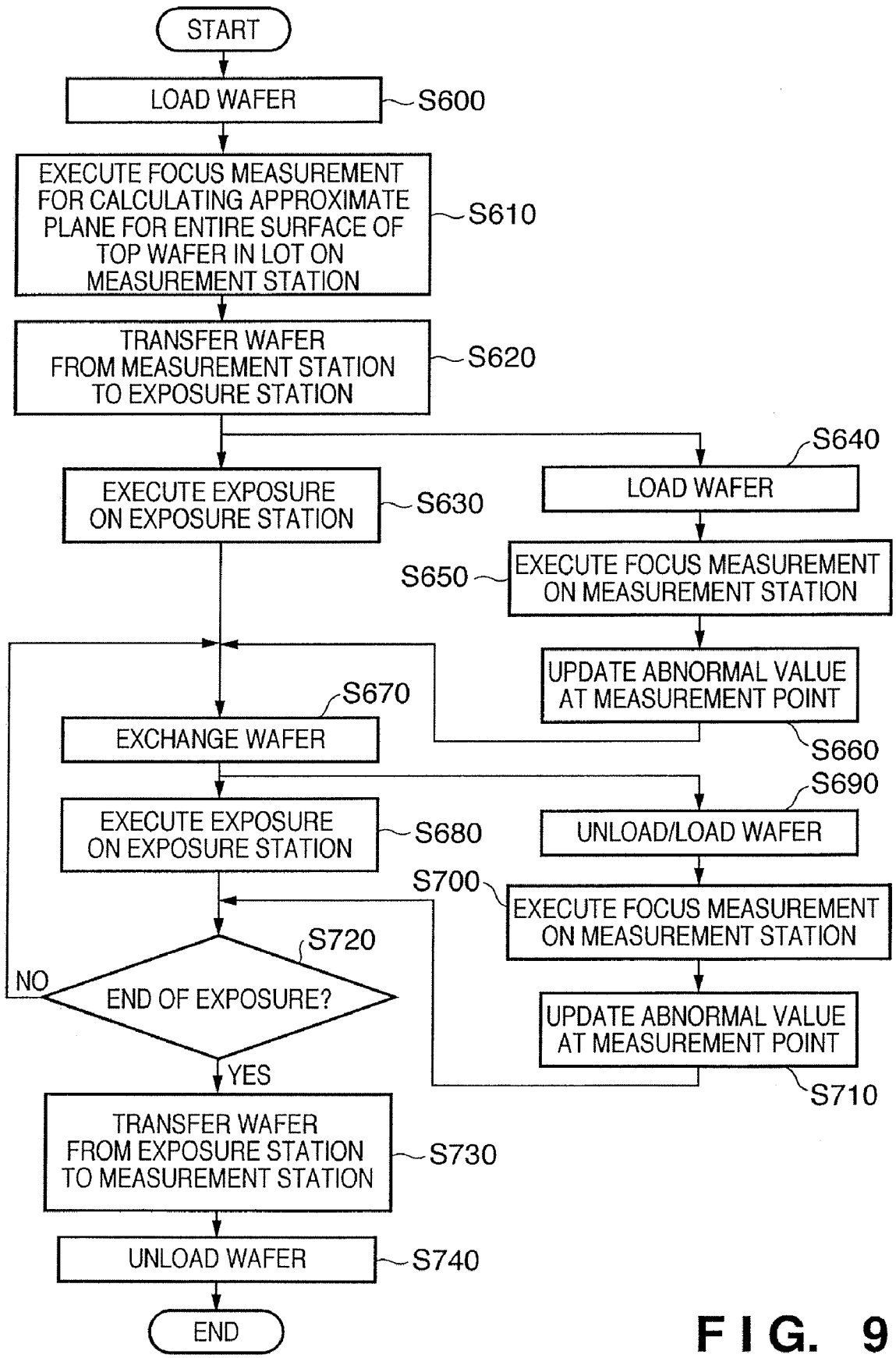
FIG. 9 is a flowchart illustrating a focus measurement method according to a seventh embodiment.
Figure 10:
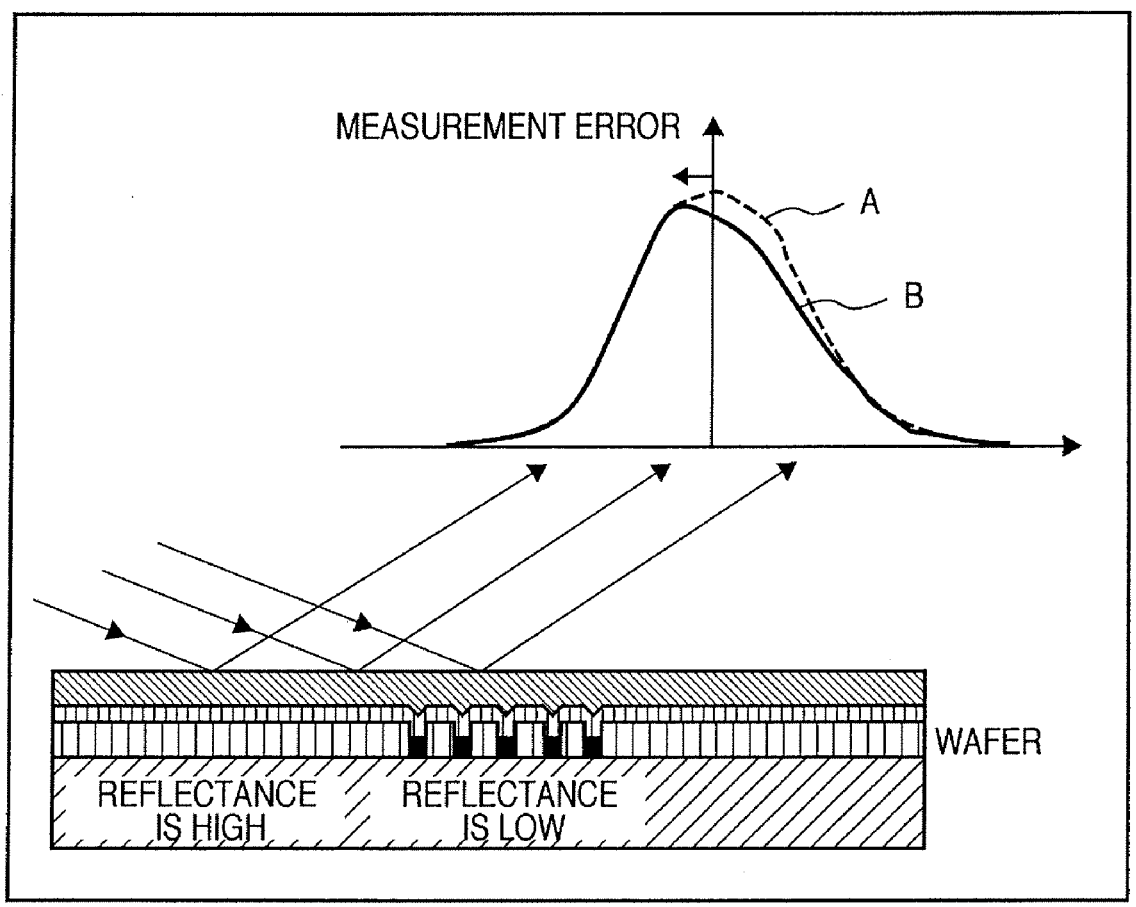
FIG. 10 describes a measurement error due to the reflectance difference of the pattern on the wafer.
Figure 11:
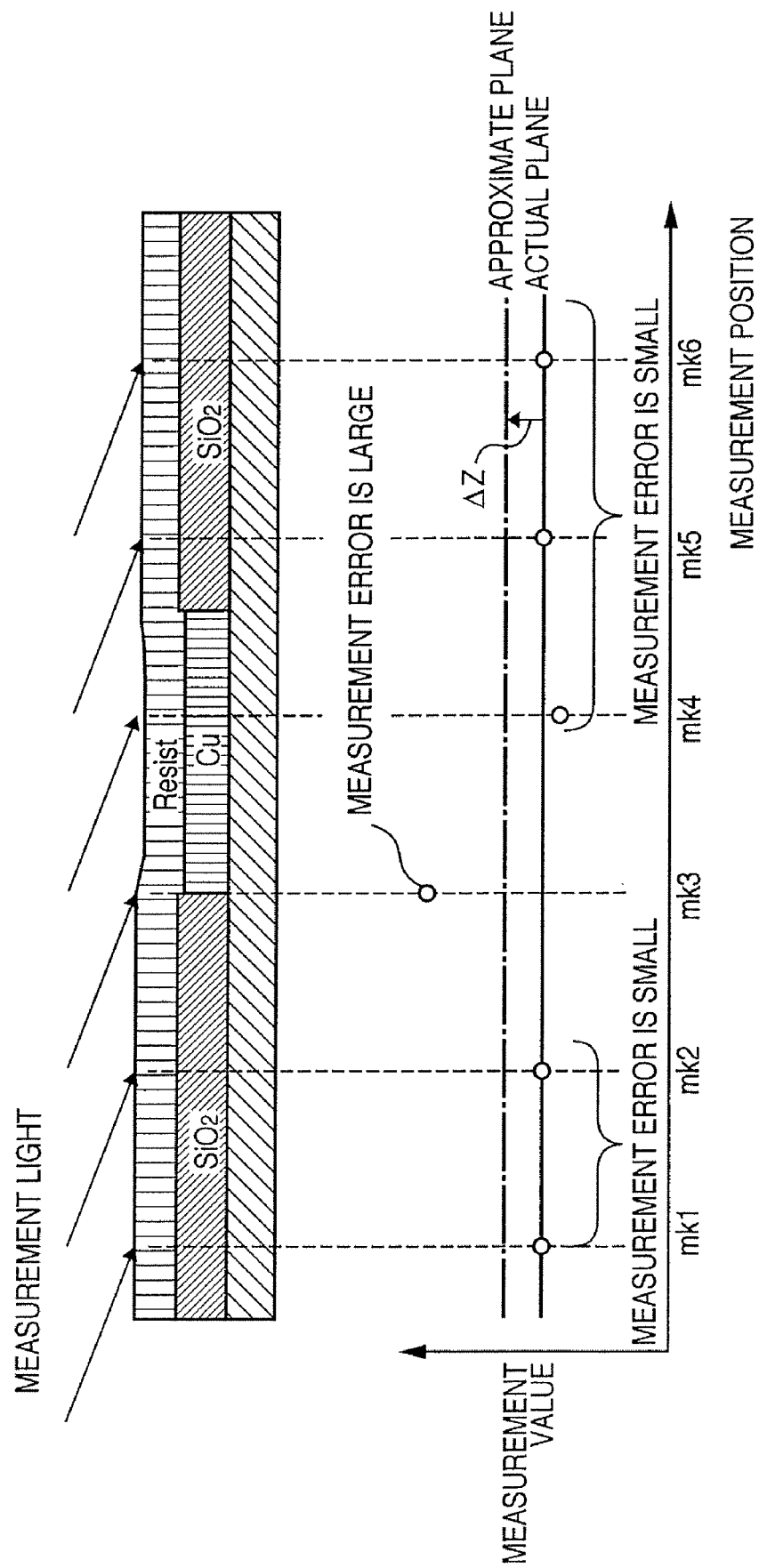
FIG. 11 describes an error of an approximate plane from an actual plane.

FIG. 9 is a flowchart illustrating a focus measurement method according to the seventh embodiment.

The seventh embodiment is an example in which the focus measurement method is applied to a twin stage, as in the sixth embodiment, and to all of the wafers in a lot on a measurement station.

A characteristic feature of the seventh embodiment is as follows. To deal with a case wherein an anomalous value at a measurement point has varied in the middle of processing of the lot, each wafer undergoes focus measurement. If the measurement point that is determined to be an anomaly is different from that of the previous wafer, the selected measurement point is updated to calculate an approximate plane using the updated measurement point.

Referring to FIG. 9, the top wafer in the lot is loaded onto the measurement station (S600). After that, the entire surface of the top wafer in the lot undergoes focus measurement on the measurement station to select a plurality of measurement points on the entire surface of the wafer. At the same time, an offset from an approximate plane at a valid measurement point is calculated and stored in the apparatus (S610).

In step S620, the top wafer is transferred from the measurement station to the exposure station. In step S630, the top wafer is exposed on the exposure station. In step S640, the second wafer is loaded while the top wafer undergoes exposure. In step S650, the second wafer undergoes focus measurement on the measurement station. In step S660, each measurement point on the first wafer determined in step S610 is compared with a corresponding measurement point determined in step S650. If anomalous values at an identical measurement point are different from each other, this measurement point is updated. At the same time, an offset from an approximate plane at the updated valid measurement point is calculated and stored in the apparatus.

In step S670, the exposed wafer on the exposure station is exchanged with the unexposed wafer on the measurement station. The unexposed wafer is exposed using the focus measurement result obtained in step S650 and the offset obtained in step S660 (S680). Meanwhile, the exposed wafer is recovered in step S690 to load the third wafer onto the measurement station. On the measurement station, the third wafer undergoes focus measurement in step S700. In step S710, each measurement point on the second wafer determined in step S650 is compared with a corresponding measurement point determined in step S700. If the anomalous values at an identical measurement point are different from each other, this measurement point is updated. At the same time, an offset from an approximate plane at the updated valid measurement point is calculated and stored in the apparatus.

The processes in steps S670 to S710 are repeated until all of the wafers are exposed. When the last wafer is exposed, it is transferred from the exposure station to the measurement station in step S730 and recovered in step S740.

Other Embodiments

Although anomalous values are determined for respective elements of each of a plurality of measurement marks to select measurement points in each of the above-described embodiments, the present invention is not limited thereto. Anomalous values of elements of measurement portions, i.e., measurement marks, may be collectively determined. That is, when a focus measurement value uniformly changes over all of the elements in the relationship between the pitch of a measurement mark at a certain measurement portion and the pitches of the sparse and dense patterns of the wafer, the measurement reliability at the measurement portion is low. In such a circumstance, determination based on all the measurement marks is sometimes better.

According to the embodiment, a change in focus measurement value is averaged by the number of elements of a measurement mark. If the average value exceeds a separately set tolerance, and a variation, e.g., a standard deviation, in changes of measurement values falls within the set value, it is possible to determine all of the measurement marks, i.e., all elements, at the measurement portion, to be anomalies.

Device Manufacturing Method

Following is a description of an embodiment of a device manufacturing method using the above-described exposure apparatus.

Figure 12:
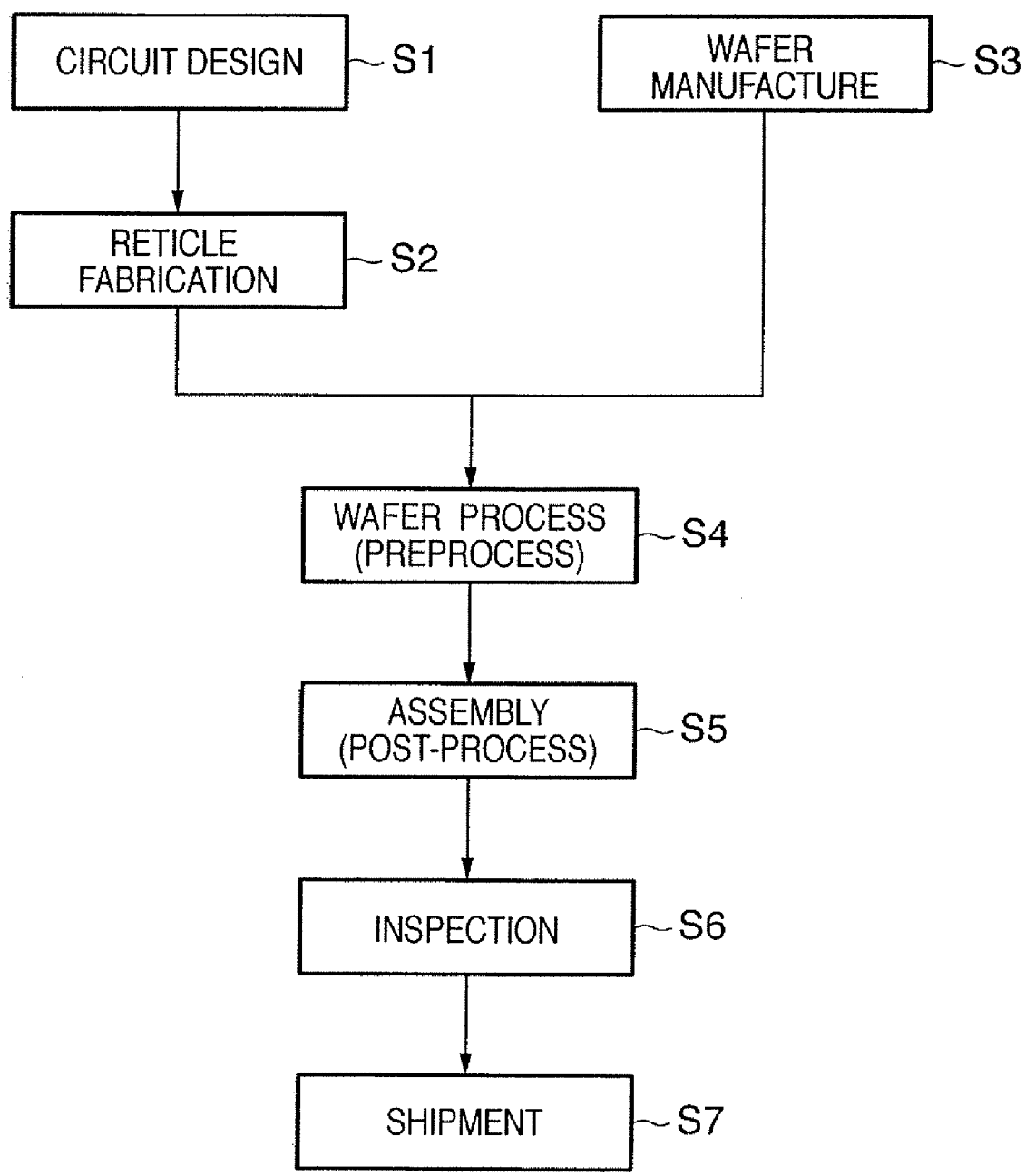
FIG. 12 is a flowchart illustrating a device manufacturing method.

FIG. 12 shows a sequence for manufacturing a microdevice, e.g., a semiconductor chip such as an IC or an LSI, a liquid crystal panel, a CCD, a thin-film magnetic head, or a micromachine. In step S1, circuit design, a circuit of a semiconductor device is designed. In step S2, reticle fabrication, a reticle is fabricated on the basis of the designed circuit pattern. In step S3, wafer manufacture, a wafer is manufactured using a material such as silicon. In step S4, wafer process, called a preprocess, the exposure apparatus forms an actual circuit on the wafer by lithography using the reticle and the wafer. In step S5, assembly, called a post-process, a semiconductor chip is formed using the wafer manufactured in step S4. The step includes such processes as assembly, i.e., dicing and bonding, and packaging, i.e., chip encapsulation. In step S6, inspection, an inspection is performed, including an operation check test and a durability test of the semiconductor device manufactured in step S5. A semiconductor device is completed with the processes and shipped in step S7.

Figure 13:
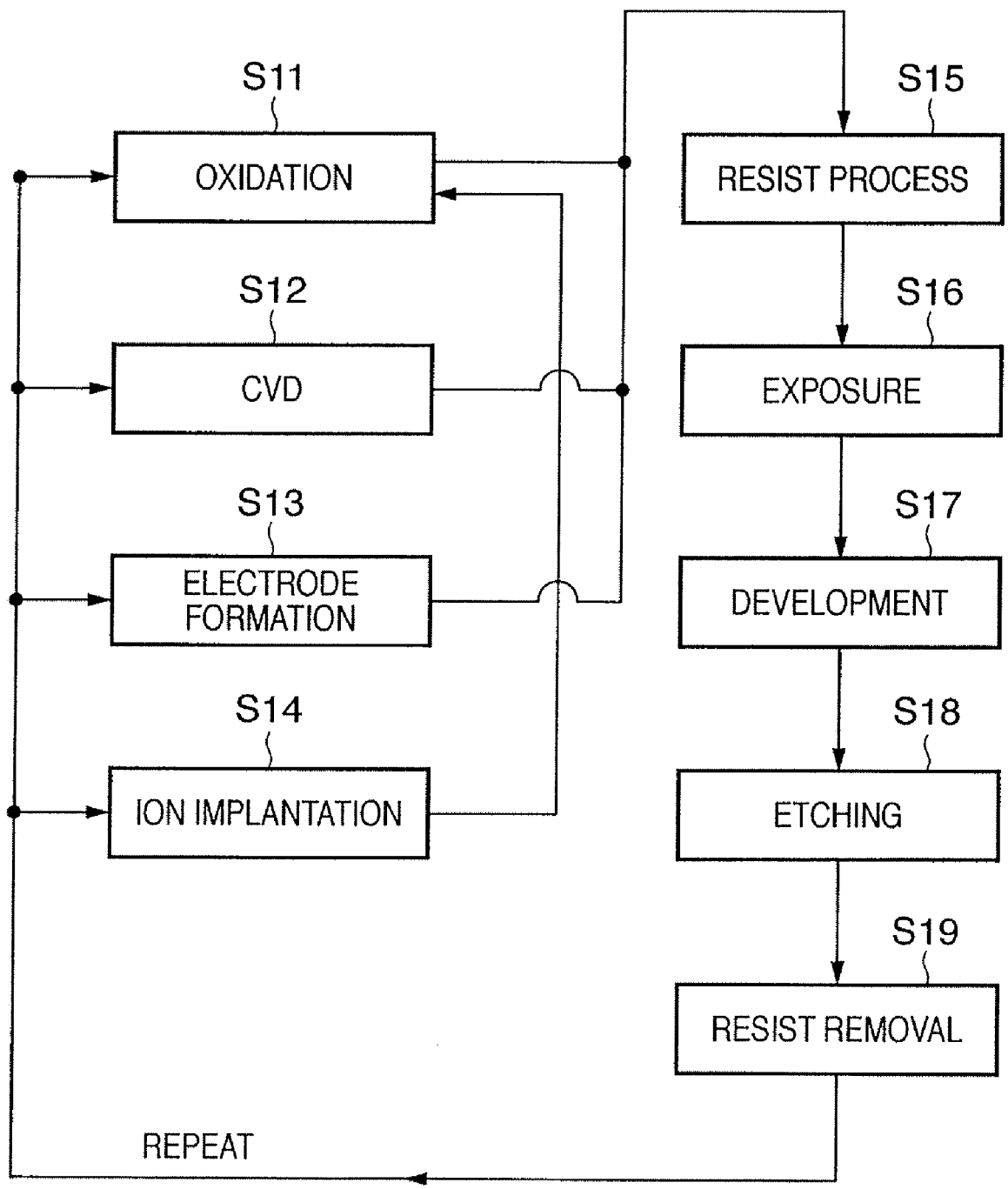
FIG. 13 is a flowchart illustrating a wafer process.

FIG. 13 shows a detailed sequence of the wafer process. In step S11, oxidation, the surface of the wafer is oxidized. In step S12, CVD, an insulating film is formed on the wafer surface. In step S13, electrode formation, an electrode is formed on the wafer by deposition. In step S14, ion implantation, ions are implanted into the wafer. In step S15, resist process, a photosensitive agent is applied to the wafer. In step S16, exposure, the above-described exposure apparatus prints the circuit pattern onto the wafer by exposure. In step S17, development, the exposed wafer is developed. In step S18, etching, portions other than the developed resist image are etched. In step S19, resist removal, any unnecessary resist remaining after etching is removed. Repeating the steps foil is a multilayered circuit pattern structure on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-165359, filed Jun. 14, 2006 which is hereby incorporated by reference herein in its entirety.

What is claimed is:

1. A scanning exposure apparatus comprising:
   a stage unit configured to support a reticle and to be movable in a scanning direction;
   an illumination unit configured to illuminate the reticle;
   a projection optical system configured to project a pattern of the reticle onto the substrate;
   a stage unit configured to support a substrate and to be movable in the scanning direction and a direction perpendicular to both the scanning direction and an optical axis of the projection optical system;
   a detector configured to detect a surface position of the substrate by irradiating a surface of the substrate with light and to receive light reflected by the surface of the substrate; and
   a controller configured:
      (i) to execute a first measurement that causes the detector to detect the surface position with respect to each of a first plurality of measurement points in a shot on the substrate, and to execute a second measurement that causes the detector to detect the surface position with respect to each of a second plurality of measurement points in the shot, the second plurality of measurement points being obtained by shifting the first plurality of measurement points in the shot by a predetermined amount in a predetermined direction; and
      (ii) to select measurement points to be used for subsequent measurement using the detector from the first plurality of measurement points, based on a change in the detected surface positions of two measurement points corresponding to each other in the first and second plurality of measurement points.

2. An apparatus according to claim 1, wherein the controller is configured to select, from the first plurality of measurement points, a measurement point with respect to which the change does not exceed a threshold value.

3. An apparatus according to claim 2, wherein a manufacturing process of the substrate defines the threshold value.

4. An apparatus according to claim 1, wherein the controller is configured to shift the first plurality of measurement points in one of the scanning direction and the direction perpendicular to the scanning direction, to obtain the second plurality of measurement points.

5. An apparatus according to claim 1, wherein
   the detector is configured to project a plurality of measurement marks onto the surface of the substrate with light, each including a plurality of mark elements, each corresponding to one of the first plurality of measurement points, and
   the controller is configured to select a measurement point with respect to each of the plurality of mark elements.

6. An apparatus according to claim 1, wherein
   the detector is configured to project a plurality of measurement marks onto the surface of the substrate with light, each including a plurality of mark elements, each corresponding to one of the first plurality of measurement points, and
   the controller is configured to select a measurement point with respect to each unit of the plurality of mark elements.

7. The apparatus according to claim 5, wherein the predetermined amount is not more than half a width of the mark element in the predetermined direction.

8. An apparatus according to claim 1, wherein the controller is configured to execute the first and second measurements with respect to a first sample shot on a top substrate in a lot.

9. An apparatus according to claim 1, wherein the controller is configured to execute the first and second measurements with respect to each of all sample shots on a top substrate in a lot.

10. An apparatus according to claim 1, wherein the controller is configured to execute the first and second measurements with respect to each of all exposure shots on a top substrate in a lot.

11. An apparatus according to claim 1, wherein the controller is configured to execute the first and second measurements with respect to each of all exposure shots on all substrates in a lot.

12. A method of manufacturing a device, said method comprising the steps of:
   exposing a substrate to light via a reticle using a scanning exposure apparatus defined in claim 1;
   developing the exposed substrate; and
   processing the developed substrate to manufacture a device.

* * * * *